(12) United States Patent
Assulin et al.

(10) Patent No.: US 11,355,309 B2
(45) Date of Patent: Jun. 7, 2022

(54) SENSOR FOR ELECTRON DETECTION

(71) Applicant: APPLIED MATERIALS ISRAEL LTD., Rehovot (IL)

(72) Inventors: Itay Assulin, Rehovot (IL); Jacob Levin, Rehovot (IL); Guy Eytan, Kidron (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 17/265,187

(22) PCT Filed: Aug. 1, 2019

(86) PCT No.: PCT/IL2019/050872
§ 371 (c)(1),
(2) Date: Feb. 1, 2021

(87) PCT Pub. No.: WO2020/026249
PCT Pub. Date: Feb. 6, 2020

(65) Prior Publication Data
US 2021/0319976 A1     Oct. 14, 2021

(30) Foreign Application Priority Data
Aug. 2, 2018 (IL) .......................................... 260956

(51) Int. Cl.
*H01J 37/244* (2006.01)
(52) U.S. Cl.
CPC ..... *H01J 37/244* (2013.01); *H01J 2237/0213* (2013.01); *H01J 2237/2443* (2013.01); *H01J 2237/24475* (2013.01)

(58) Field of Classification Search
CPC ............. H01J 37/244; H01J 2237/0213; H01J 2237/2443; H01J 2237/24475;
(Continued)

(56) References Cited

U.S. PATENT DOCUMENTS

| | | | |
|---|---|---|---|
| 7,285,786 B2 * | 10/2007 | Sims | G01T 1/1644 250/288 |
| 7,999,222 B2 * | 8/2011 | Shishika | H01J 49/40 250/287 |

(Continued)

FOREIGN PATENT DOCUMENTS

JP     2017120192     7/2017

OTHER PUBLICATIONS

Greco et al., (2016). Ohmic contacts to Gallium Nitride materials. Applied Surface Science, 383, 324-345.
(Continued)

*Primary Examiner* — David A Vanore
(74) *Attorney, Agent, or Firm* — Lowenstein Sandler LLP

(57) ABSTRACT

The present invention relates to a sensor for electron detection emitted from an object to be used with a charged particle beam column being operated at a certain column and wafer voltage. The sensor is configured and operable to at least reduce interaction of negative ions with the active area of the sensor while minimizing electrons energy loss. The sensor is also configured and operable to minimize both gradual degradation of a cathodoluminescence efficiency of the active area and dynamic change of cathodoluminescence generated during operation of the sensor and evolving throughout the scintillator's lifetime.

15 Claims, 8 Drawing Sheets

(58) Field of Classification Search
CPC ....... H01J 2237/2448; H01J 2237/2803; H01J 49/02; G01T 1/20; G01T 1/2002; G01T 1/2006; H01L 33/50
See application file for complete search history.

(56) References Cited

U.S. PATENT DOCUMENTS

| | | | | |
|---|---|---|---|---|
| 8,506,845 | B2 * | 8/2013 | Ohashi | C09K 11/628 |
| | | | | 252/301.4 H |
| 9,851,453 | B2 * | 12/2017 | Honda | G01T 1/2002 |
| 10,535,493 | B2 * | 1/2020 | Ioakeimidi | H01J 37/26 |
| 10,907,096 | B2 * | 2/2021 | Blahuta | G01T 1/2023 |
| 11,062,892 | B2 * | 7/2021 | Imamura | H01J 37/244 |
| 2004/0069950 | A1 | 4/2004 | Ando et al. | |
| 2004/0108492 | A1 | 6/2004 | Derenzo et al. | |
| 2005/0089142 | A1 | 4/2005 | Marek | |
| 2008/0116368 | A1 | 5/2008 | Uchiyama et al. | |
| 2021/0319976 | A1 * | 10/2021 | Assulin | H01J 37/244 |

OTHER PUBLICATIONS

Foresi et al., (1993). Metal contacts to gallium nitride. Applied physics letters, 62(22), 2859-2861.

Huang et al., (2008). A transmission electron microscopy observation of dislocations in GaN grown on (0001) sapphire by metal organic chemical vapor deposition. Japanese Journal of Applied Physics, 47(10R), 7998.

Bridger et al., (1999). Measurement of induced surface charges, contact potentials, and surface states in GaN by electric force microscopy. Applied physics letters, 74(23), 3522-3524.

Brillson et al., (1999). Defect formation near GaN surfaces and interfaces. Physica B: Condensed Matter, 273, 70-74.

Lin et al., (1994). Low resistance ohmic contacts on wide band-gap GaN. Applied Physics Letters, 64(8), 1003-1005.

Fan et al., (1996). Very low resistance multilayer Ohmic contact to n-GaN. Applied Physics Letters, 68(12), 1672-1674.

Ruvimov et al., (1996). Microstructure of Ti/Al and Ti/Al/Ni/Au Ohmic contacts for n-GaN. Applied Physics Letters, 69(11), 1556-1558.

Schmitz et al., (1996). Schottky barrier properties of various metals on n-type GaN. Semiconductor Science and Technology, 11(10), 1464.

Ping et al., (1996). Ohmic contacts to n-type GaN using Pd/Al metallization. Journal of electronic materials, 25(5), 819.

Ishikawa et al., (1997). Effects of surface treatments and metal work functions on electrical properties at p-GaN/metal interfaces. Journal of applied physics, 81(3), 1315-1322.

Liu et al., (1998). A review of the metal-GaN contact technology. Solid-State Electronics, 42(5), 677-691.

Würfl et al., (1999). Reliability considerations of III-nitride microelectronic devices. Microelectronics Reliability, 39(12), 1737-1757.

Sawada et al., (2002). Characterization of metal/GaN Schottky interfaces based on I-V-T characteristics. Applied surface science, 190(1-4), 326-329.

Wei-Hua et al., (2009). Shock-assisted superficial hexagonal-to-cubic phase transition in GaN/Sapphire interface induced by using ultra-violet laser lift-of techniques. Chinese Physics Letters, 26(1), 016203.

\* cited by examiner

SENSOR FOR ELECTRON DETECTION

TECHNOLOGICAL FIELD

The present invention relates to the field of radiation scintillation detectors. More specifically, the present invention relates to a scintillation-based sensor structure useful for electron detection.

BACKGROUND

Scintillators are substances which, when hit by radiation such as alpha rays, beta rays, gamma rays, X rays, or neutrons, absorb the radiation to generate fluorescence. The scintillator, in combination with a photodetector, such as a photomultiplier tube, can constitute a radiation detector. Luminescent materials, when struck by an incoming particle, absorb its energy and scintillate (i.e., re-emit the absorbed energy in the form of light). Various systems, such as scanning electron microscopes (SEM) and electron beam inspection tools, may include a scintillator and a light guide. There is a growing need to provide reliable and fast scintillators having a long lifetime.

GENERAL DESCRIPTION

An object may be evaluated (measured, inspected and/or reviewed) by illuminating the object with electrons. Secondary electrons or back-scattered electrons (BSE) that are reflected and/or scattered from the object are then detected. Accordingly, a scintillator is bombarded with secondary electrons or back-scattered electrons under a certain acceleration voltage, and emits detectable light accordingly, by cathodoluminescence (CL). The light is substantially collected by a light guide. Photons generated inside the scintillator are emitted in all directions and are subject to re-absorption and total internal reflection due to the scintillator and substrate refraction index. When a scintillator-light guide scheme is used as a detector, one of the tasks to be considered in its design is to maximize the photons' transfer into the light guide. For this purpose, a coating is applied to the surfaces of the scintillator to reflect the photons back to the scintillator.

The inventors surprisingly found that the scintillator is also bombarded by negative ions. These negative ions are substantially accelerated towards the scintillator, causing in turn a degradation of the scintillator's efficiency. This damage mechanism is extremely efficient and occurs within a very short time period, and, if not mitigated, causes immediate and irreversible degradation of the scintillator. The source of negative ions is contaminants and hydrocarbons on the imaged sample or wafer, and not on the scintillator. The negative ions are formed by a process known as electron stimulated desorption (ESD) so their existence is inherent to scanning electron microscope (SEM) imaging of samples. They reach the scintillator due the fields' distribution in the SEM.

To solve this problem associated with the bombardment of negative ions, the present invention provides a sensor having inter alia a coating structure interfacing a scintillator structure which is exposed to the electrons emitted from the object. The coating structure is configured to have a certain thickness being selected to at least reduce interaction of negative ions with the active area while minimizing electron energy loss when impacting with the coating structure. The term "at least reduce interaction of negative ions" refers to decelerating and containing the negative ions path within the coating structure, such that the negative ions do not reach the scintillator active area. In this way, the coating structure prevents the negative ions from damaging the scintillator material (i.e. active area) by at least reducing (e.g. completely eliminating) interaction of negative ions with the scintillator structure.

The coating structure is also intended to produce a contact to a bias electrode. This provides acceleration voltage to secondary and BSE electrons, and closes the electrical loop of the current carried by the incident beam as well as by secondary electrons. The coating structure is configured and operable to improve electrical contact and/or maintain a uniform potential across the interface between the active area of the scintillator structure and the coating structure (i.e. homogenization of the electrical potential across the sensor). The coating structure may have a planar shape which may or may not be continuous. For example, a structure having a grid shape may be used. Moreover, the coating structure has a certain material composition being selected to reflect back photons emitted by the active area towards the active area (i.e. to reflect back the photons that are produced inside the scintillator to maximize photons' output to the light guide connected to the scintillator on its rear side).

Therefore, according to a broad aspect of the present invention, there is provided a sensor for electron detection emitted from an object to be used with a charged particle beam column being operated at a certain column and wafer voltage. The sensor comprises a scintillator structure having an active area and a certain lifetime. The scintillator structure comprises a fast scintillator material (e.g. having a decay time in the order of ns) being configured and operable to emit photons at a certain wavelength range by cathodoluminescence and, upon impact of electrons at a certain impact energy and a coating structure, interfacing the scintillator structure and being exposed to the electrons emitted from the object. The coating structure is configured and operable to maintain a uniform potential across the interface between the active area and the coating structure. The coating structure has a certain material composition being selected to reflect back photons emitted by the active area towards the active area. The coating structure also has a certain thickness being selected to at least reduce interaction of negative ions with the active area while minimizing electron energy loss when impacting with the coating structure.

In some embodiments, the scintillator structure comprises a semiconductor III-V multiple quantum wells structure.

In some embodiments, the certain thickness is determined by energy at which the negative ions interact with the active area according to the certain column and wafer voltage.

In some embodiments, the thickness is selected according to the type of negative ions damaging the active area.

In some embodiments, the coating has a thickness of at least 200 nm.

In some embodiments, the certain material composition comprises a conductive material such that the coating structure is configured and operable as an electrode applying an electrical potential to accelerate secondary and back scattered electrons towards the sensor.

Unfortunately, damage of a scintillator structure is not related only to negative ions bombardment. The direct bombardment of the scintillator with the secondary electrons or back-scattered electrons causes degradation of efficiency of the luminescence of the scintillator after a certain dose. This also causes a dynamic effect that changes scintillator light output over short period of times (scale of image grab).

For example, degradation of efficiency of the scintillator may be up to 50% after a dose of 0.3 C/cm² and even 90% in some cases.

To solve the above-mentioned problems associated with the gradual degradation of a cathodoluminescence efficiency of the active area and a dynamic change of cathodoluminescence generated during operation of the sensor and evolving throughout the scintillator's lifetime, the present invention provides a coating structure comprising a multi-coating structure. The multi-coating structure defines a profile having different physical and chemical properties along its depth. The different physical and chemical properties along its depth comprises a certain material composition and a certain thickness. The above-mentioned properties are selected to minimize both gradual degradation of a cathodoluminescence efficiency of the active area and a dynamic change of cathodoluminescence generated during operation of the sensor and evolving throughout the scintillator's lifetime. Two factors affect the optical intensity of the cathodoluminescence: transmission of secondary and back scattered electrons through the coating structure (the effective excitation level) and losses in the optical mode due to absorption in the coating structure or at the interface between the scintillator structure and the coating structure. The material composition of the coating structure is selected according to the interface chemistry between the coating material and the scintillator material on which it is deposited. The reflectivity/absorption of the coating structure material to the wavelength of operation is taken into account. If reflectivity of the coating at the emitted wavelength is high, then the scintillator efficiency is improved and vice versa. The coating structure is capable of passivating surface states and homogenizing surface potential to form a good equipotential interface. The use of different materials enables to appropriately control contact, chemistry of the interface between the coating structure and the scintillator structure, and formation of inter-layers influencing the degree of homogenization of surface potential and passivation of the defects terminating at the scintillator structure surface.

In some embodiments, the multi-coating structure may comprise at least two different coating materials having different reflection coefficients at the certain wavelength range of the emitted photons. The multi-coating structure may be made of at least two layers. The two layers may have different thicknesses.

In some embodiments, the multi-coating structure may comprise a first reflective material interfacing the active area, and a second reflective material interfacing electron emission from the object. The first reflective material has a reflection coefficient lower than the second reflective material. The first reflective material interfacing the active area may be selected to enable good Ohmic contact (i.e. low resistance) to mitigate the effect of at least one of surface states, defects and electronic traps. The second reflective layer may have a thickness selected according to the type of negative ions damaging the scintillator structure. The present invention provides thus a sensor for electron detection emitted from an object configured to have an increased lifetime. The term "lifetime" or "lifespan" refers to both the rate of decrease of the scintillator's efficiency, and the stability of its efficiency/output (i.e. the dynamic transient effect described above). Sufficiently long lifetime (in relation to the dose it will accumulate per specific working conditions) and stability of scintillator output without transient effects are significant parameters for performance of the scanning electron microscope.

According to another broad aspect of the present invention, there is provided a sensor for electron detection emitted from an object to be used with a charged particle beam column being operated at a certain column and wafer voltage. The sensor comprises a scintillator structure having an active area and a certain lifetime. The scintillator structure comprises a fast scintillator material being configured and operable to emit photons at a certain wavelength range by cathodoluminescence, and upon impact of electrons at a certain impact energy and a multi-coating structure interfacing the scintillator structure. The term "multi-coating structure" refers to a structure having different physical and chemical properties along its depth, such as material, reflection coefficient, thickness, chemical properties, conductance etc. In particular, both the thickness and material of the multi-coating structure are specifically configured to solve the lifetime issue described above, and to optimize efficiency. The change in reflection properties may be continuous, or the multi-coating structure may define two geometric regions having different reflection properties. In other words, the multi-coating structure may comprise at least two different coating materials having different reflection coefficients at the certain wavelength range of the emitted photons.

The upper surface of the multi-coating structure interfaces, the scintillator structure, and its bottom surface all receive the electron charged particle emission from the object. Therefore, the bottom surface of the multi-coating structure (which is opposite to the surface interfacing the scintillator structure) is configured to be directly exposed to the environment (e.g. vacuum) to receive an electron charged particle emission from the object. The multi-coating structure/layer may be made of two or more different coating materials, or of one composite material having different physical and chemical specific properties. The multi-coating structure (e.g. the certain material composition) is configured and operable to reflect back photons emitted by the scintillator structure towards the scintillator structure, to control interface properties with the active area of the scintillator structure towards the active area. The certain thickness is selected to minimize both the gradual degradation of the cathodoluminescence efficiency of the active area and the dynamic effect (e.g. dynamic change of cathodoluminescence generated during operation of the sensor and evolving throughout the scintillator's lifetime).

In some embodiments, the present invention relates to a sensor for electron detection emitted from an object. The sensor consists of a scintillator comprising a scintillator material being configured and operable to emit photons upon impact of electrons, and a multi-coating structure interfacing the scintillator structure. In this connection, it should be understood that for operating the sensor of the present invention, the sensor does not need to comprise a further layer.

In some embodiments, the scintillator structure comprises a semiconductor III-V multiple quantum wells structure.

In some embodiments, the multi-coating structure is made of at least two layers. The two layers may have different thicknesses.

In some embodiments, the multi-coating structure comprises two different coating materials: a first reflective material interfacing the active area, and a second reflective material interfacing an electron charged particle emission from the object. The first reflective material (i.e. the additional coating material) has a reflection coefficient lower than the second reflective material being configured for reflecting the photons back towards the semiconductor scintillator structure. The first reflective material interfacing the active area may be selected to enable good Ohmic contact to mitigate the effect of at least one of surface states, defects and electronic traps.

In some embodiments, at least one of the coating materials is a conductive material such that the multi-coating structure is configured and operable as an electrode applying an electrical potential to the sensor. In some embodiments, both materials are conductive.

A ratio between a thickness of the first reflective material and a thickness of the second reflective material may exceed 1:10 or 1:20. A thickness of the first reflective material may be in the range of about 2 to 50 nanometers. A thickness of the second reflective material may be in the range of about 20 to 600 nanometers.

According to another broad aspect of the present invention, there is provided a method for electron detection emitted from an object. The method comprises receiving electrons by a scintillator; emitting photons, by the scintillator and due to reception of the electrons. Emitting of the photons comprises emitting photons towards a light guide and emitting photons towards a multi-coating structure interfacing the scintillator. It additionally comprises reflecting towards the scintillator by the multi-coating structure, photons that have passed through the multi-coating structure. An interface between the scintillator and the multi-coating structure is thus configured and operable to be controlled.

According to another broad aspect of the present invention, there is provided a method of increasing the lifetime of a sensor for electron detection emitted from an object to be used with a charged particle beam column being operated at a certain column and wafer voltage. The method comprises providing a scintillator structure having an active area comprising a fast scintillator material. The method also comprises interfacing a scintillator structure with a multi-coating structure being configured for reflecting back photons emitted by the scintillator material, and defining different physical and chemical properties along its depth. Additionally, the method comprises controlling interface properties (e g minimizing both gradual degradation of a cathodoluminescence efficiency of the active area and dynamic change of cathodoluminescence generated during operation of the sensor and evolving throughout the scintillator's lifetime), and increasing the lifetime of the sensor.

In some embodiments, the method further comprises selecting materials of the multi-coating structure, (e.g. selecting at least two materials of the multi-coating structure) and a certain thickness thereof.

In some embodiments, the method further comprises eliminating interaction of negative ions with the scintillator structure Eliminating the interaction of negative ions with the scintillator material may further comprise selecting a thickness of the multi-coating structure.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which.

DETAILED DESCRIPTION OF EMBODIMENTS

Figure 1A:
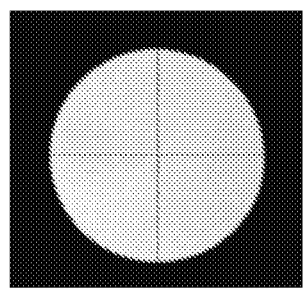
FIGS. 1A and 1B show typical cathodoluminescence images of detector areas which are not damaged and uniform.
Figure 1B:
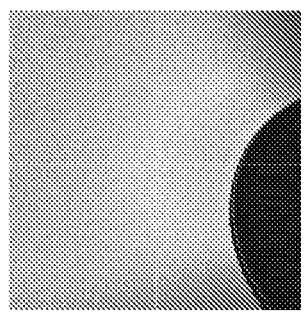
Figure 1C:
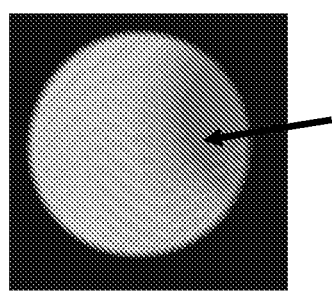
FIGS. 1C and 1D show cathodoluminescence images of ions damaged areas in the scintillator.
Figure 1D:
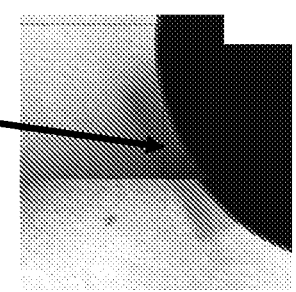

As described above, the inventors surprisingly found that during operation the scintillator is also bombarded by negative ions. FIG. 1A and FIG. 1B show an imaged region of an object with and without the presence of a damaging ions beam respectively. Such negative ions are formed near a surface of an object bombarded by electrons, and are generated by an electron-stimulated desorption process. As illustrated in FIGS. 1C-1D, the negative ions are created on the surface of the object being inspected, and are drawn into the charged particle beam column by the electric fields generated by the column. The ions are accelerated by a certain electric potential, collide with the detector, and damage it. Elimination of interaction of negative ions with the scintillator structure provides a stable cathodoluminescence during operation, and fast operation.

Figure 1E:
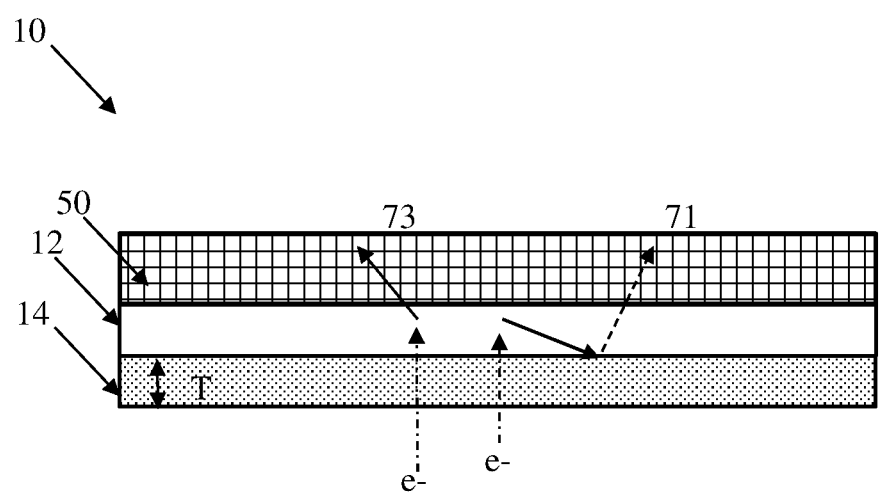
FIG. 1E illustrates an example of a schematic diagram representing a sensor for electron detection emitted from an object and a propagation of photons within the sensor according to some embodiments of the present invention.

The present invention enables to provide detector scintillators being sufficiently immune to ion damage, while not impairing current performance. This may be implemented by appropriately selecting a thickness and/or a material of the coating structure. The coating structure is configured and operable to prevent ions originating at the surface of the object from reaching the scintillator structure. Thus, the lifetime of the scintillator structure is increased, and likewise the lifetime of the sensor. Referring to FIG. 1E, there is illustrated, by way of a schematic diagram, a sensor 10 of the present invention, configured and operable for electron detection emitted from an object. Sensor comprises a scintillator structure 12 (e.g. scintillator film) being made of a fast scintillator material being configured and operable to emit photons at a certain wavelength range by cathodoluminescence and upon impact of electrons e– and a coating structure 14 interfacing the scintillator structure 12 and being exposed to the electrons e– emitted from the object. The photons generated by the scintillator material may propagate in various directions. For example, photon 73 emitted by the scintillator structure 12 propagates towards a light guide 50 being incorporated in a charged particle beam column (shown in FIG. 3). However, some photons as illustrated in 71 are emitted by the scintillator structure 12 in a direction different than towards the light guide 50. The coating structure 14 is thus configured to have a certain reflection property selected for redirecting photons emitted by the scintillator structure 12 propagating towards the coating structure 14 back to the scintillator structure 12. In other words, the coating structure has a certain material composition being selected to reflect back photons emitted by the scintillator material towards the active area of the scintillator structure. The term "active area" refers to the area on which the scintillator structure exhibits radiation sensitivity. The coating structure 14 is also configured to have a certain thickness T being selected to at least reduce (e.g. completely eliminate) interaction of negative ions with the active area while minimizing electrons energy loss when impacting with the coating structure 14. Coating structure 14 is made thick enough (for example a few hundred nanometers (e.g. in the range of about 200 nanometers to 600 nanometers) to substantially prevent the negative ions from reaching scintillator structure 12 while allowing electrons (such as secondary electrons and/or backscattered electrons) from reaching scintillator structure 12. In this connection, it should be noted that making coating structure 14 too thick may reduce the energy of the electrons that pass through coating structure 14. However, since coating structure 14 prevents ion damage, the thickness of T coating structure 14 may provide a tradeoff between sensitivity of the sensor and its longevity. The thickness T of coating structure 14 may be determined based on the one or more parameters of the system that includes the sensor. For example, thinner elements may be required when stopping negative electrons of lower energy. Lower or higher energy of negative ions impinging the sensor may be obtained when using different potential schemes along the system. The one or more parameters of the system may include any operational condition, any illumination parameter, any collection parameter, the predefined required lifetime of the scintillator, and an allowable amount of negative ions that may reach the scintillator. The parameters may also include an allowable percentage of negative ions that may reach the scintillator, any parameter related to the negative ions and/or any parameter related to electrons detected by the sensor, the identity of the negative ions (for example, negative hydrogen ions), the energy of the negative ions when reaching the sensor, the distribution of the negative ions when reaching the sensor, the acceleration voltage that directs the negative ions towards the sensor, any parameter of an electrostatic field in the vicinity of the sensor, any parameter of a magnetic field in the vicinity of the sensor, the energy of the electrons when reaching the sensor, the distribution of the electrons when reaching the sensor, and the like. Thickness T of coating structure 14 may be selected according to the type of negative ions damaging the active area. Specifically, ions may be heavier or lighter, thus coating configurations may change accordingly. After determining that the negative ions are of a different identity (for example hydrogen), the path of the negative ions within the coating structure 14 may be measured and/or simulated, and the coating structure 14 may be designed to be thicker than the depth of path. Coating structure 14 interfacing scintillator structure 12 has the functionality to uniformly distribute the voltage bias (i.e. a certain column and wafer voltage) that is applied to the scintillator structure over the surface of the scintillator. Coating structure 14 is thus configured and operable to maintain a uniform potential across the interface between the active area and the coating structure.

In this connection, it should be noted that the thickness T of the coating structure 14 should be appropriately selected, on the one hand, to stop propagation of the negative ions. On the other hand, it should not overly decelerate the electrons moving towards the scintillator structure 14. In other words, the coating thickness T is tailored, on the one hand, to block ions from reaching the active area. On the other hand, such tailoring minimizes electrons energy loss in order to maximize efficiency. The efficiency of the reflection of the coating structure enables to provide the electrons the capability of being evacuated and to minimize their trapping. Moreover, the thickness T may be determined by the energy at which the ions hit the sensor. This energy is determined by scintillator and object potential. In other words, the certain thickness T may be determined by the energy at which the negative ions interact with the active area according to the certain column and wafer voltage. The thickness T may also be selected according to the type of negative ions damaging the active area. The exact thickness T of the coating structure 14 is determined per working conditions and sensor configuration, and may be changed to accommodate these conditions still within the guidelines mentioned above, to mitigate the ions issue. In a specific and non-limiting example the coating has a thickness of at least 200 nm for electrons having an impact energy in the range of about 9 to 15 kV.

Moreover, it should be understood that the problems associated with the interaction of negative ions are particularly significant when a fast scintillator material is used. Therefore, for example, the scintillator structure comprises a semiconductor III-V multiple quantum wells structure. For example, the scintillator material may be a heterostructure. For example, the scintillator material may emit in the ultraviolet or blue or yellow spectrum. For example, the semiconductor III-V multiple quantum wells structure may comprise a nitride semiconductor layer referring to a compound that contains at least one of Ga, In, and Al as a Group III element and contains N as a principal Group V element.

It should be noted that, although, in the figure, scintillator structure 12 and coating structure 14 are illustrated as having a planar shape, this is merely an example. It will be appreciated that for simplicity and clarity of illustration, elements shown in the figures have not necessarily been drawn to scale. Coating structure 14 may be deposited on scintillator structure 12 by any deposition method (e.g. by thermal evaporation). Coating technologies have been well researched, and there are numerous suitable coatings and layers that may be included in the present invention. Additionally, there are numerous ways of forming coatings known in the art with optical and/or protective properties required for the present invention.

Coating structure 14 may be formed by a single layer of material or may comprise a plurality of layers, although not specifically shown. In some embodiments, coating structure 14 comprises a multi-coating structure having different physical and chemical properties along its depth. The multi-coating structure is configured to have a certain material composition and a certain thickness. These are selected to minimize both gradual degradation of a cathodoluminescence efficiency of the active area and a dynamic change of cathodoluminescence generated during operation of the sensor and evolving throughout the scintillator's lifetime. Different thicknesses and configurations of this coating and sensor may be used, even in the same scanning electron microscope.

In some embodiments, the multi-coating structure may comprise at least two different coating materials having different reflection coefficients at the certain wavelength range of the emitted photons. The multi-coating structure may be made of at least two layers. The two layers may have different thicknesses.

In some embodiments, the multi-coating structure may comprise a first reflective material interfacing the active area and a second reflective material interfacing an electron emission from the object. The first reflective material may have a reflection coefficient lower than the second reflective material. The first reflective material interfacing the surface of the active area may be selected to enable good Ohmic contact with the surface of the scintillator structure to mitigate the effect of at least one of surface states, defects and electronic traps. The second reflective layer may have a thickness selected according to the type of negative ions damaging the scintillator structure. The first reflective material and the second reflective material may thus have different thicknesses. In a specific and non-limiting example, the first reflective material may be made relatively thin (for example in the range of about 3 to 20 nanometers (e.g. 15 nanometers)) due to the lower reflection coefficient. However, the thickness of the first reflective material should be configured to mitigate the lifetime issue and minimize reduction of efficiency, due to the lower reflective coefficient. Furthermore, the second reflective material is made thick enough (for example a few hundred nanometers (e.g. in the range of about 200 nanometers to 600 nanometers) to substantially prevent the negative ions from reaching the scintillator structure while allowing electrons (such as secondary electrons and/or backscattered electrons) from reaching the scintillator. In this connection, it should be noted that making the second reflective material thick enough may reduce the energy of the electrons that pass through the second reflective material. However, since the second reflective material prevents ion damage, the thickness of the second reflective material may provide a tradeoff between sensitivity of the sensor and its longevity. It should be noted that the first reflective material or a combination of the first reflective material and the second reflective material may be configured to substantially prevent the negative ions from reaching the scintillator structure. Increasing the thickness of the first reflective material may increase the role of the first reflective material in substantially preventing the negative ions from reaching the scintillator structure. For example, when the first reflective material is expected to take the major role (or the exclusive role) of substantially preventing the negative ions from reaching the scintillator, then the first reflective material may be thicker than the second reflective material. It should be noted that the thickness of the first reflective material and/or the thickness of the second reflective material may be determined based on the one or more parameters of the system that includes the sensor. In some embodiments, the second reflective layer has a thickness and/or material selected according to the type of negative ions damaging the scintillator structure.

Figure 2A:
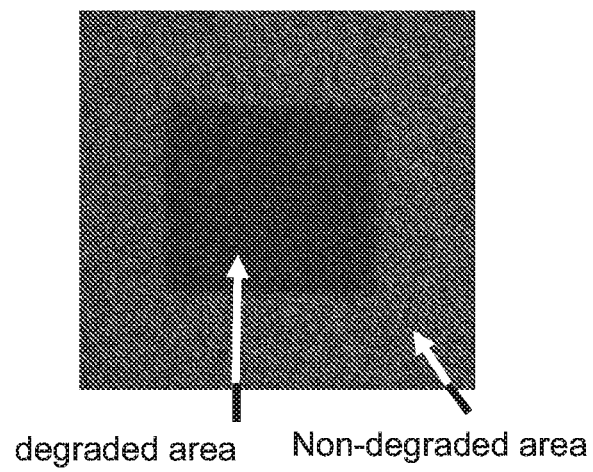
FIG. 2A is a picture showing cathodoluminescence image of an area in the scintillator that demonstrates a non-degraded area and an area which was degraded by accumulating a dose electrons hitting it in standard working conditions.
Figure 2B:
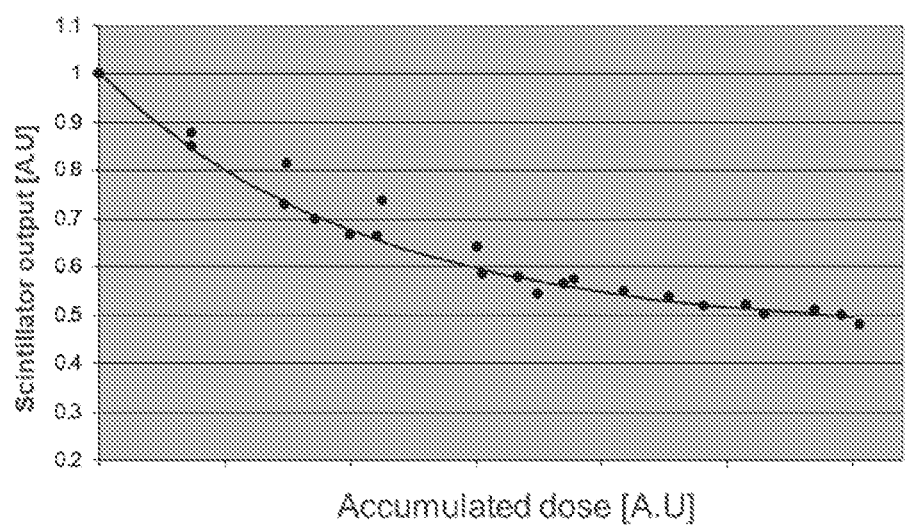
FIGS. 2B-2C illustrate the degradation and its dynamic effect respectively.
Figure 2C:
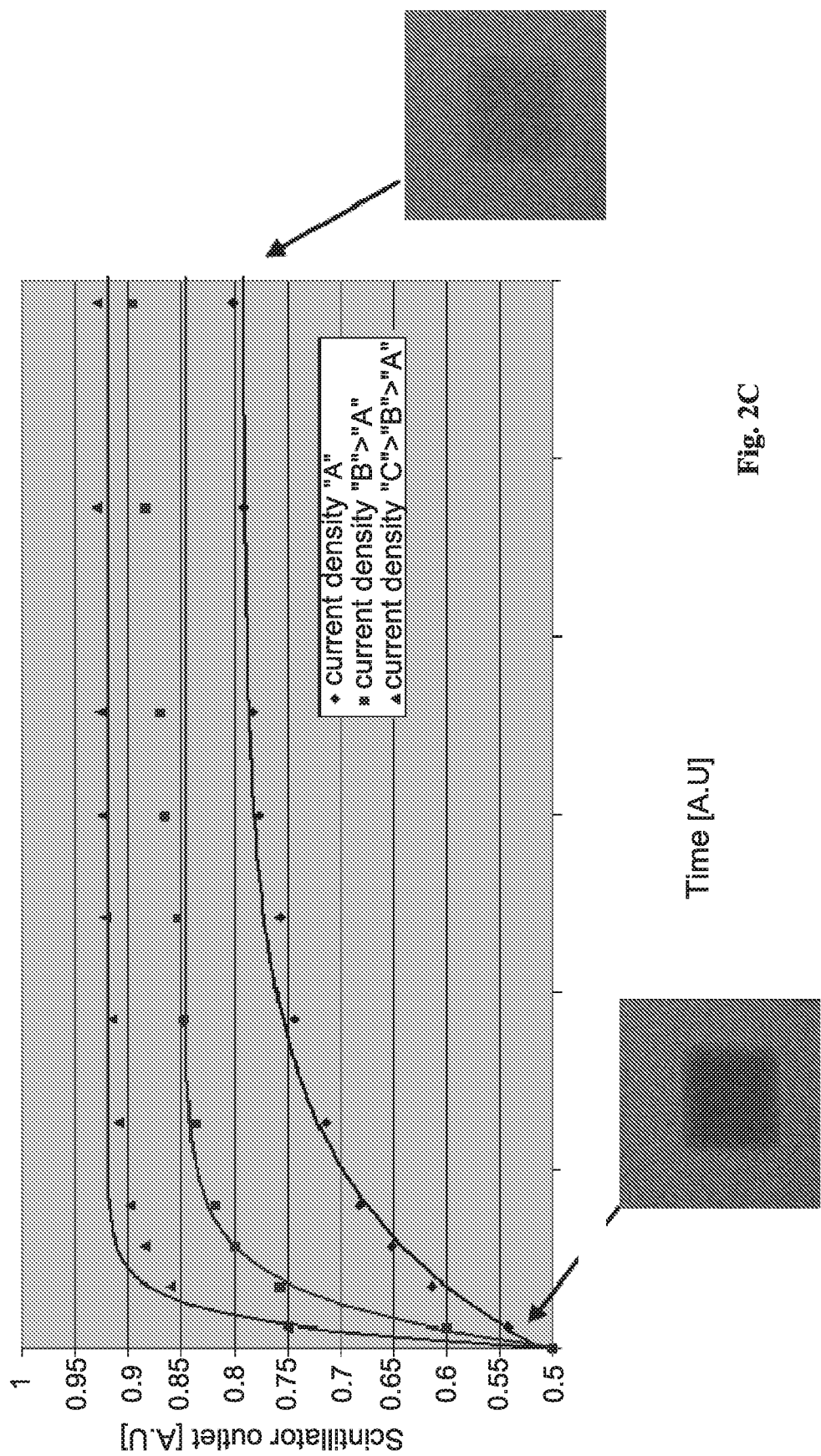

As described above, another problem associated with the degradation of efficiency of the luminescence of the scintillator is in the damage of a scintillator structure caused by the secondary electrons or back-scattered electrons. Reference is made to FIG. 2A showing a cathodoluminescence image of a scintillator structure having a degraded area and a non-degraded area surrounding the degraded area. Degradation of efficiency of the scintillator increases with an accumulated electron dose over time. The electron bombardment creates additional defects (or enlarges lower efficiency region around existing ones) in the scintillator structure and therefore reduces cathodoluminescence efficiency. More specifically, the accumulated dose of the electrons emitted by an object causes degradation of the scintillator efficiency with increased dose (i.e. degradation of cathodoluminescence) and a dynamic/temporal/transient effect (referred to hereinafter after as a dynamic effect), causing a change of cathodoluminescence during operation. These two effects reduce the lifetime of the scintillator-based detector. The dynamic behavior is due to two effects: efficiency recovery and efficiency decay-back. The recovery occurs when the scintillator is exposed to an electron flux, the first exposure timeframe (e.g. the first frame in a multiple frames image grab) shows the above degradation, but the consecutive timeframes are brighter. After recovery, if no electrons hit the detector, the efficiency slowly (e.g. in the order of minutes) decays back to the degraded value. This process can be referred to decay-back. The process of decay back is related to relaxation from carrier excitation in material with internal defects bringing carriers back to the defect. Reference is made to FIGS. 2B-2C illustrating the degradation effect. More specifically, the scintillator output vs. the accumulated dose in arbitrary units is represented in FIG. 2B in the scale of the accumulated dose. The scintillator output at different current densities as a function of time in arbitrary units is represented in FIG. 2C in the scale of the image acquisition. The unwanted dynamic effect when exposing scintillator to electrons is clearly shown in the figure. The recovery rate and saturation value depend on current density. Higher current density saturates efficiency at a higher level. Higher current density causes a faster recovery. The dynamic effect increases thus with accumulated dose and is highly dependent on the current density impacting the scintillator during operation, and the short term history of this current density. More specifically, the dynamic effect may change according to specific illumination and/or collection conditions of current evaluation iterations, and is also affected by previous evaluation iterations. A constant and stable decrease in efficiency of the scintillator may be mitigated or compensated. To the contrary, the dynamic effect is harder to compensate due to the abovementioned dependencies of the effect. The timescale for accumulating this dynamic effect may be a function of the operating conditions of the system that includes the scintillator, and may range, for example, between several months to one year of operation. The source of the dynamic effect was found to be surface states at the surface of the scintillator structure. These surface states originate from the physical properties of the scintillator material and its growth method and are an inherent property of the scintillator material. In this connection, it should be noted that the effects reducing the lifetime of the scintillator-based detector as described, are observed in particular with fast scintillators.

Figure 2D:
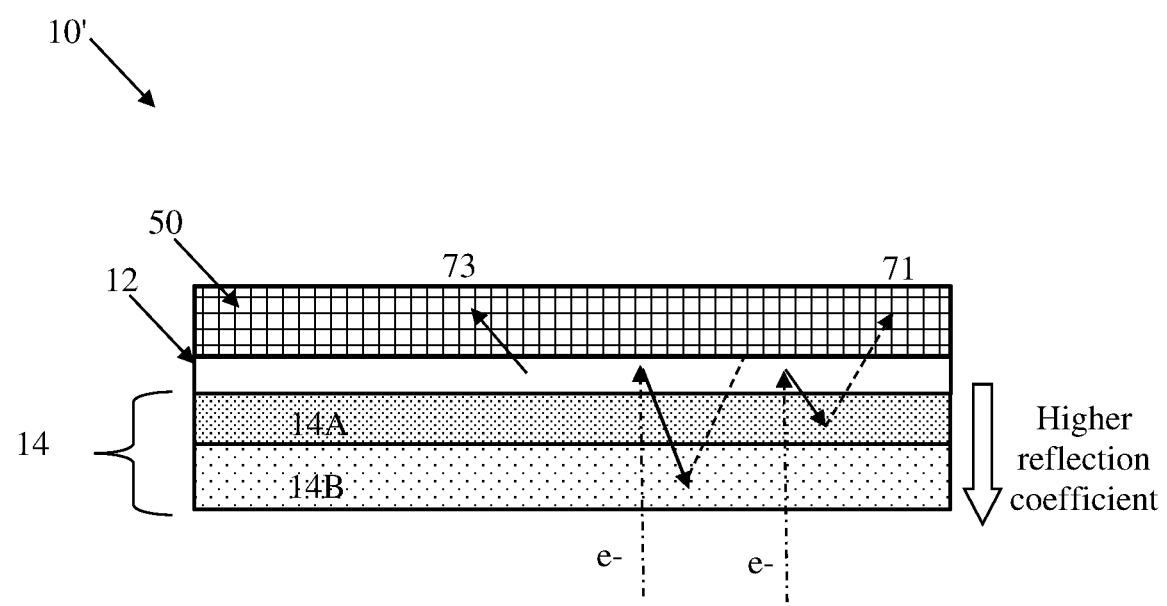
FIG. 2D illustrates an example of a schematic diagram representing a sensor for electron detection emitted from an object and a propagation of photons within the sensor according to some embodiments of the present invention.

Referring to FIG. 2D, there is illustrated, by way of a schematic diagram, a sensor 10' of the present invention configured and operable for electron detection emitted from an object. According to this broad aspect of the invention, sensor 10' comprises a scintillator structure 12 (e.g. scintillator film) being made of a fast scintillator material. The scintillator structure 12 is configured and operable to emit photons at a certain wavelength range by cathodoluminescence and upon impact of electrons e- and a multi-coating structure 14 interfacing the scintillator structure. The present invention provides a sensor for electron detection emitted from an object to be used with a charged particle beam column being operated at a certain column and wafer (i.e. acceleration) voltage configured to have an increased lifetime.

The inventors found that different material and different thickness lead to different degradation and different recovery. Some materials provide a maximum efficiency but the lowest lifetime, and some materials provide a low efficiency but the longest lifetime. Therefore, the present invention provides a multi-coating structure having different physical and chemical properties along its depth. A unique combination of selected material at selected thicknesses provides a sensor with an increased lifetime and optimized efficiency. The change in these properties may be continuous, or the multi-coating structure may define two geometric regions having different properties. It may be made of two different coating materials or of one composite material having specific properties (e.g. a single material having the above-mentioned properties).

In this connection, it should be understood that the quantum wells, under excitation, emit photons. These photons spread to fill-up the volume formed by the whole scintillator structure, and before they leave this volume, they form internal "modes". The optical mode within the scintillator structure is partly confined by total internal reflection at the boundaries, but it also spreads slightly beyond the interfaces, and includes an evanescent part at the interface between the scintillator structure and the coating structure. This interface may be transparent or absorbing. If the interface is transparent, it acts as a dielectric cladding (no loss). However, if the interface is absorbing, part of the luminescence is not collected by the sensor, and is absorbed at the interface. Therefore, the material composition of the multi-coating structure of the present invention is appropriately selected to control the interface properties minimizing optical losses. Moreover, it should also be noted that, as described above, a native oxide layer, as well as hydrocarbon and any other contamination, may cover the scintillator surface before the coating. An oxidized scintillator surface may alter the electrical properties of the sensor. To this end, in the present invention, the material composition of the coating material interfacing the scintillator surface may be selected to be $O_2$-scavenger, sucking the oxygen from under-layers. In this way, degradation of the optical efficiency of the sensor is minimized.

Such minimization of the dynamic effect provides a uniform non-degraded efficiency of the sensor over time. Because of the physical properties of the scintillator material and its growth method, the semiconductor scintillator material (e.g. single crystal or multiple quantum wells) comprises defects and surface states generating electron traps. The following may be a physical explanation of the source of such effects. The defects, when charged, may produce local potential barriers for electrical charges, and may become non-radiative recombination sites (heating centers). The defects may behave as traps, depleted volumes, non-radiative recombination centers, and local heating, and are susceptible to extend or multiply under strong excitation (e.g. e-beam irradiation). These electron traps may generate a local electrical potential (i.e. raises the potential in both conduction band and valence band), producing repulsion for free electrons, generating in turn a local depletion layer. The depletion layer may locally reduce the carrier density, and thus reduce radiative recombination and total efficiency, and also facilitate the dynamic effect described above. As described above, the surface states may create a dynamic effect of change in the cathodoluminescence intensity and reduce the lifetime of the sensor. The technique of the present invention mitigates these effects (e.g. by neutralizing these surface states), and thereby increases the efficiency and uniformity of efficiency of the sensor and its lifetime. The multi-coating structure may be made of at least two materials having different physical properties. In this connection, it should be understood that if a single coating layer is used to reflect emitted photons towards the scintillator structure, this single coating layer should be made of material having a sufficiently high reflection coefficient to efficiently reflect back the photons. However, materials having high reflection coefficient do not have the desired physical and chemical properties to mitigate the lifetime effect described above. Moreover, such materials may not have good electrical contact with the scintillator material, such that the surface states created at the surface of the scintillator material are not neutralized. In some embodiments, the selected material(s) should thus have a good Ohmic contact with the defect cores extending to the surface of the scintillator material, neutralizing the charge in them. This in turn flattens the potential around the defect, and prevents or lowers the formation of new traps.

Moreover, coating materials used with scintillator semi-conductor materials create a chemical reaction at the interface between the coating material and the semiconductor material. An intermediate layer, being usually non-conductive, may then be created reducing the efficiency of the sensor. The inventors found that, surprisingly, introducing an additional coating material at the interface with the semiconductor scintillator material, increases the lifetime of the sensor. The sensor of the present invention has an increased lifetime, and a stable cathodoluminescence during operation, with minimal impact on sensor efficiency.

In this specific and non-limiting example of FIG. 2D, the multi-coating structure 14 is made of at least two layers. The multi-coating structure 14 is configured and operable to reflect back photons emitted by the active layer towards the scintillator structure 12. The multi-coating structure 14 is also configured and operable to mitigate the lifetime effect. Specifically, it may be configured to avoid reduction of radiative recombination and the related dynamic effect mentioned above. Controlling the quality and properties of the interface between the coating and the scintillator structure, provides stable uniform cathodoluminescence during operation. For example, this may be implemented by providing a material having a good electrical (e.g. Ohmic) contact with the scintillator material to mitigate the effect of surface states, defects and electronic traps (e.g. neutralize surface states at the surface of the scintillator structure). The multi-coating structure 14 may thus be configured and operable to minimize both gradual degradation of a cathodoluminescence of the scintillator structure 12 and dynamic change of cathodoluminescence during operation of the sensor 10'. In some embodiments, the multi-coating structure 14 is made of at least one conductive material so that it may serve as an electrode applying an electrical potential to the sensor. In this specific and non-limiting example, the multi-coating structure 14 comprises at least two different coating materials 14A and 14B which have different physical and chemical properties such as reflection coefficients at the certain wavelength range of the emitted photons, conductance and other chemical properties. In a specific and non-limiting example, a reflection coefficient of one coating material is about 0.5 for the specific wavelength emitted from the scintillator and >0.9 for the second coating material. For other materials providing the same properties of mitigating the lifetime issue and ions issue, these values may be different (e.g. 0.8 for the first coating material and >0.9 for the second coating material). The first reflective material 14A interfaces the scintillator structure 12 and the second reflective material 14B interfaces an electron emission from the object. The first reflective material 14A has a reflection coefficient which is lower than the second reflective material 14B. In this connection, it should be understood that the second reflective material 14B is selected to reflect back, in an efficient manner, photons emitted by the scintillator structure 12. Accordingly, the first reflective material 14A reflects some of the photons (from the scintillator) back to the scintillator structure 12. For example, photon 73 emitted by the scintillator structure 12 propagates towards a light guide 50 being incorporated in a charged particle beam column (shown in FIG. 3). The figure also shows photon 71 emitted by the scintillator structure 12 towards the first reflective material 14A and further redirected from the first reflective material 14A towards the scintillator structure 12. The second reflective material 14B is configured to reflect the photons that pass through the first reflective material 14A towards the second reflective material 14A back towards the scintillator structure 12. For the sake of illustration, photon 72 is emitted from the scintillator structure 12 towards the first reflective material 14A and propagates towards the second reflective material 14B. The second reflective material 14B redirects photon 72 towards the scintillator structure 12 (and the light guide 50) through the first reflective material 14A. The higher reflection coefficient of the second reflective material 14B causes most of the photons to be reflected back towards the scintillator structure 12. However, reflective material having a high reflection coefficient, does not mitigate or solve the lifetime issue mentioned above. The reflective material 14A has better electrical (e.g. Ohmic) contact at the interface between the reflective material 14A and the scintillator structure 12 than the reflective material 14B at the imaginary interface between the reflective material 14B and the scintillator structure 12 which may have created a less-conductive intermediate layer as described above. The specific physical properties (e.g. contact properties) of the scintillator structure 12 actually neutralize the physical mechanism that causes degradation of the scintillator and the dynamic effect. In this way, the dynamic change of cathodoluminescence during operation of the sensor is minimized while extending the lifetime of the sensor and providing uniform efficiency of the sensor over time. It should be noted that as described above, due to degradation of the scintillator material, for example after six months, the efficiency of conventional sensors, based on scintillator material known in the art, is much lower as compared to the first frame taken on the first day. The efficiency of conventional sensors based on scintillator material is thus non-uniform, cannot be predicted accurately, and therefore cannot be compensated accordingly. However, surprisingly, by using the sensor of the present invention, minimization of the dynamic effect mentioned above, causes an increase in photon radiation. The efficiency of the sensor of the present invention, due to the multi-coating structure, is uniform.

For example, at least one coating material may be made of a metal material. In a specific and non-limiting example, the multi-coating structure 14 may be made of at least two of titanium, aluminum, nitride, gold, silver, molybdenum, titanium aluminide, palladium, tungsten, indium tin oxide, zirconium diboride, chromium, platinum, vanadium, and hafnium.

In some embodiments, the first reflective material 14A and the second reflective material 14B are layers having the same thickness. In a specific and non-limiting example, the first reflective material 14A may be made relatively thin (for example in the range of about 3 to 20 nanometers (e.g. 15 nanometers))—due to the lower reflection coefficient. The second reflective material 14B may be also made relatively thin (for example in the range of about 3 to 20 nanometers (e.g. 15 nanometers)). However, the thicknesses of the first and second reflective materials should be large enough to reflect some of the photons from the scintillator back to the scintillator. Alternatively, the first reflective material 14A and the second reflective material 14B are layers having different thicknesses.

Figure 3:
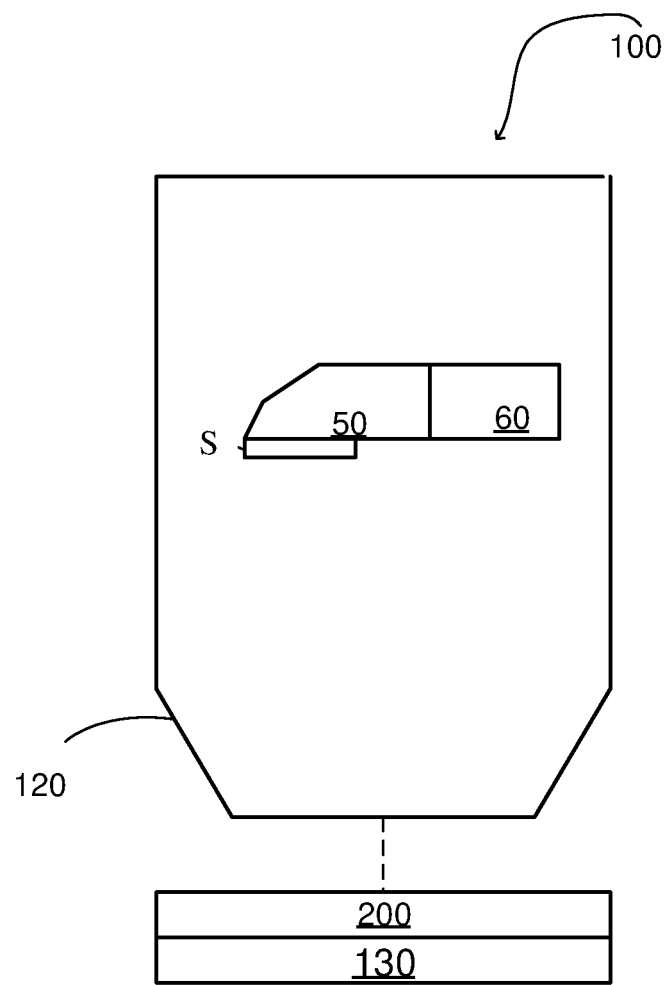
FIG. 3 illustrates an example of a schematic diagram representing a system to be used with the sensor of the present invention.

Reference is made to FIG. 3 which illustrates a system 100 to be used with the sensor of the present invention for electron detection emitted from an object. For example, system 100 may be at least a portion of a scanning electron microscope (SEM) or any other electron beam inspection tool. System 100 includes a mechanical unit 130 for supporting and moving an object 200. System 100 also includes a charged particle unit such as charged particle beam column 120 being operated at a certain column and wafer voltage. Charged particle beam column 120 is configured for irradiating the object with photons and for detecting charged particles emitted from the object 200. Charged particle beam column 120 includes sensor S of the present invention which may be implemented by sensor 10 of FIG. 1D or 10' of FIG. 2D. The configuration of system 100 is a specific and non-limiting example and sensor S may be placed at any suitable location according to the system requirements. The invention is not limited to this configuration. Sensor S is exposed to the charged particles emitted from the object 200 and emits photons at a certain wavelength range by cathodoluminescence and upon impact of the charged particles at a certain impact energy. Sensor S may be associated with a light guide 50 and a photomultiplier 60 being incorporated into the charged particle beam column 120. Light guide 50 is positioned between sensor S and the photomultiplier 60. Charged particle beam column 120 is operated at a certain column and wafer voltage, to enable propagation of photons emitted by the scintillator structure towards light guide 50. Photons emitted in a different direction than towards light guide 50 should be redirected towards light guide 50. Sensor S is therefore also configured for reflecting the photons towards the scintillating structure and further towards light guide 50.

Figure 4:
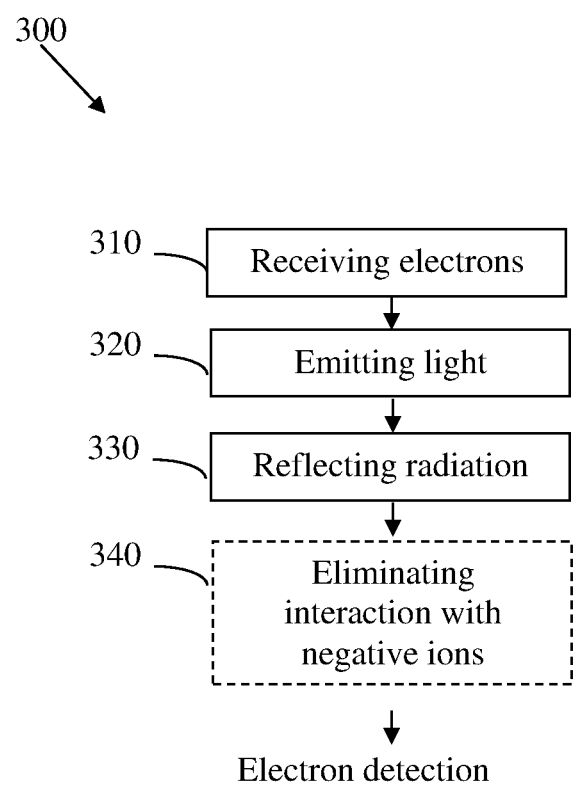
FIG. 4 illustrates a flow chart exemplifying a technique for electron detection emitted from an object.

FIG. 4 is an example of method 300 for electron detection emitted from an object. The method 300 comprises receiving electrons by a scintillator structure in 310 and emitting photons in 320 due to reception of the electrons. Emitting photons in 320 is followed by reflecting, in 330 towards the scintillator structure, photons that had passed through the coating structure. The interface between the scintillator structure and the coating structure is configured and operable to control interface properties. The method 300 may comprise substantially preventing negative ions from reaching the scintillator in 340. Such substantial prevention may include preventing all negative ions from reaching the scintillator, or preventing only a majority (for example 80%, 90%, 95%, 99%, and the like) of the negative ions from reaching the scintillator.

Figure 5:
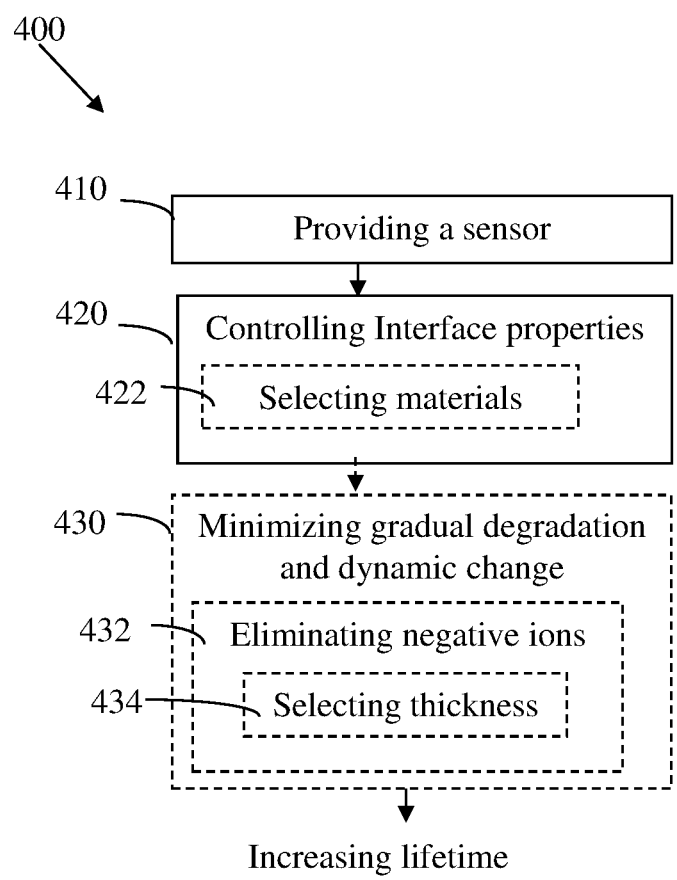
FIG. 5 illustrates a flow chart exemplifying a technique for increasing the lifetime of a sensor, based on the teachings of the present invention.

FIG. 5 is an example of method 400 for increasing the lifetime of a sensor for electron detection emitted from an object. The method 400 comprises providing a scintillator structure having an active area interfacing a multi-coating structure in 410 being configured for reflecting back photons emitted by the active area, in 420 controlling the properties of the interface between the active area and the multi-coating structure, and in 430 minimizing both gradual degradation of a cathodoluminescence efficiency of the active area and dynamic change of cathodoluminescence generated during operation of the sensor and evolving throughout the scintillator's lifetime, to thereby increase the lifetime of the sensor. Method 400 may further comprise selecting materials of the multi-coating structure in 422 to provide good electrical contact (Ohmic contact) with the scintillator material. The method 400 may further comprise in 432 of eliminating interaction of negative ions with the scintillator structure. To this end, the method 400 may further comprise in 434 of selecting a thickness of the multi-coating structure. For example, the thickness of the multi-coating structure may be increased.

What is claimed is:

1. A sensor for electron detection emitted from an object; said sensor comprising:
   a scintillator structure having an active area and a certain lifetime; said scintillator structure comprising a fast scintillator material being configured and operable to emit photons at a certain wavelength range by cathodoluminescence and upon impact of electrons at a certain impact energy; and
   a coating structure interfacing said scintillator structure and being exposed to the electrons emitted from the object; said coating structure being configured and operable to maintain a uniform potential across the interface between the active area and the coating structure; wherein said coating structure has a certain material composition being selected to reflect back photons emitted by the active area towards said active area and a certain thickness being selected to at least reduce interaction of negative ions with said active area while minimizing electrons energy loss when impacting with the coating structure.

2. The sensor of claim 1, wherein said scintillator structure comprises a semiconductor III-V multiple quantum wells structure.

3. The sensor of claim 1, wherein, said sensor is used with a charged particle beam column being operated at a certain column and wafer voltage, and the certain thickness is determined by energy at which the negative ions interact with said active area according to the certain column and wafer voltage.

4. The sensor of claim 3, wherein the thickness is selected according to the type of negative ions damaging said active area.

5. The sensor of claim 1, wherein said coating structure has a thickness of at least 200 nm.

6. The sensor of claim 1, wherein the certain material composition comprises a conductive material such that said coating structure is configured and operable as an electrode applying an electrical potential to accelerate secondary and back scattered electrons towards said sensor.

7. The sensor of claim 1, wherein said coating structure comprises a multi-coating structure having different physical and chemical properties along its depth.

8. The sensor of claim 7, wherein said multi-coating structure comprises at least two different coating materials have different reflection coefficients at the certain wavelength range of the emitted photons.

9. The sensor of claim 7, wherein said multi-coating structure is made of at least two layers.

10. The sensor of claim 9, wherein said two layers have different thicknesses.

11. The sensor of claim 7, wherein said multi-coating structure comprises a first reflective material interfacing said active area, and a second reflective material interfacing an electron emission from the object; said first reflective material having a reflection coefficient lower than the second reflective material.

12. The sensor of claim 11, wherein said first reflective material interfacing said active area is selected to enable good Ohmic contact to mitigate the effect of at least one of surface states, defects and electronic traps.

13. The sensor of claim 7, wherein said multi-coating structure has a certain material composition and a certain thickness being selected to minimize both gradual degradation of a cathodoluminescence efficiency of said active area and a dynamic change of cathodoluminescence generated during operation of the sensor and evolving throughout the scintillator's lifetime.

14. The sensor of claim 7, wherein said multi-coating structure comprises at least a first reflective material and a second reflective material, wherein the first reflective material has a thickness between 3 nanometers (nm) and 20 nm.

15. The sensor of claim 14, wherein the first reflective material and the second reflective material are metallic.

* * * * *